United States Patent
Oman

(10) Patent No.: US 7,537,965 B2
(45) Date of Patent: May 26, 2009

(54) MANUFACTURING METHOD FOR A LEADLESS MULTI-CHIP ELECTRONIC MODULE

(75) Inventor: Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 525 days.

(21) Appl. No.: 11/471,869

(22) Filed: Jun. 21, 2006

(65) Prior Publication Data

US 2007/0298544 A1 Dec. 27, 2007

(51) Int. Cl.
*H01L 21/00* (2006.01)

(52) U.S. Cl. .................. 438/123; 257/E21.51; 438/109
(58) Field of Classification Search .................. 438/123
See application file for complete search history.

(56) References Cited

U.S. PATENT DOCUMENTS

| | | | |
|---|---|---|---|
| 6,448,643 B2 * | 9/2002 | Cheah et al. ................. | 257/723 |
| 6,548,328 B1 * | 4/2003 | Sakamoto et al. ........... | 438/121 |
| 6,812,552 B2 * | 11/2004 | Islam et al. ................. | 257/666 |
| 7,033,866 B2 * | 4/2006 | Chow et al. ................. | 438/123 |
| 7,378,299 B2 * | 5/2008 | Koh et al. ................... | 438/123 |
| 7,420,266 B2 * | 9/2008 | Takahashi .................... | 257/669 |
| 2002/0180011 A1 * | 12/2002 | Tanaka ........................ | 257/676 |

OTHER PUBLICATIONS

Xuejun Fan, Combined Thermal and Thermomechanical Modeling for a Multi-Chip QFN Package with Metal-Core Printed Circuit Board; IEEE Inter Society Conference on Thermal Phenomena, 2004.

* cited by examiner

*Primary Examiner*—David A Zarneke
(74) *Attorney, Agent, or Firm*—Jimmy L. Funke

(57) ABSTRACT

A leadless multi-chip electronic module with leadframe bond pads is manufactured in a manner to place small signal bond pads in a central region of the module for significantly increased reliability of solder joints between such bond pads and a substrate of the module. A linear array of parallel leadframe elements disposed in a central region of the module and bridging first and second larger IC leadframe bond pads are converted into signal bond pads by a pair of partial bottom-side saw cuts. The saw cuts run parallel to and adjacent the first and second IC bond pads to electrically isolate the leadframe elements from the IC bond pads and other bond pads. The partial saw cuts are made following encapsulation and preferably before leadframe singulation.

12 Claims, 4 Drawing Sheets

MANUFACTURING METHOD FOR A LEADLESS MULTI-CHIP ELECTRONIC MODULE

TECHNICAL FIELD

The present invention relates to leadless multi-chip electronic modules, and more particularly to a method of manufacturing a leadless multi-chip electronic module having improved solder joint reliability.

BACKGROUND OF THE INVENTION

A conventional leadless multi-chip electronic module is generally designated by the reference numeral 10 in FIGS. 1A and 1B. Referring to FIGS. 1A-1B, the module 10 (which may be QFN or PQFN devices, for example) comprises two or more integrated circuit (IC) chips 12, 14, metal leadframe bond pads 16a-16d and a substrate 18. Large bond pads 16a, 16b are provided for each IC chip 12, 14; and a plurality of signal bond pads 16c and power bond pads 16d are provided to interface the IC chips 12, 14 to the substrate 18. Terminals on the exposed face of the IC chips 12 and 14 are electrically coupled to the signal and power bond pads 16c and 16d by wirebonds 20, as shown. A plastic or epoxy encapsulant 22 covers the IC chips 12 and 14, the upper and lateral surfaces of the leadframe bond pads 16a-16d and the wirebonds 20, leaving only the lower surfaces of the leadframe bond pads 16a-16d uncovered. Following singulation of the leadframe bond pads 16a-16d, their exposed lower surfaces are soldered to a set of conductor pads 24 formed on the inboard face 18a of substrate 18.

Due to leadframe layout considerations, a conventional leadless multi-chip electronic module 10 is generally configured with the large IC bond pads 16a and 16b occupying a central region of the module 10, and the signal and power bond pads 16c and 16d occupying the peripheral or marginal region of the module 10. In the illustration of FIG. 1A, for example, the signal and power bond pads 16c and 16d are respectively disposed along the top and bottom edges of the module 10, with the IC bond pads 16a and 16b disposed in a central region between the signal and power bond pads 16c and 16d. While this sort of layout is desirable from a manufacturing standpoint, it can cause reliability problems in applications where the module 10 is used in environments subject to widely varying ambient temperatures such as occur in outdoor or vehicular systems. In such environments, the CTE (coefficient of thermal expansion) differences between the leadframe elements 16a-16d and the substrate 18 can result in solder joint cracking, particularly in the case of small solder joints 26 between the substrate 18 and the signal bond pads 16c located at the periphery of the module 10. Solder joints 26 located at or near the corners of the module 10 are particularly vulnerable to thermal-related failures.

A typical way of improving solder joint reliability is to increase the surface area of the signal bond pads 16c located at the periphery of the module 10, particularly in the corners, as illustrated in FIG. 1A. However, increasing the bond pad surface area limits the pin-count of the module 10, and only marginally improves the solder joint reliability. Accordingly, what is needed is a way of significantly improving the solder joint reliability of a leadless multi-chip electronic module.

SUMMARY OF THE INVENTION

The present invention is directed to a method of manufacture of leadless multi-chip electronic module with leadframe bond pads, where small signal bond pads are disposed in a central region of the module for significantly increased reliability of solder joints between such bond pads and a substrate of the module. A linear array of parallel leadframe elements disposed in a central region of the module and bridging first and second larger IC leadframe bond pads are converted into signal bond pads by a pair of partial bottom-side saw cuts parallel to and adjacent the first and second IC bond pads. The partial saw cuts remove portions of the leadframe elements adjacent the first and second IC bond pads and thereby electrically isolate the leadframe elements from the IC bond pads and other bond pads. The partial saw cuts are made following encapsulation and preferably before leadframe singulation.

DESCRIPTION OF THE PREFERRED EMBODIMENT

In general, the present invention provides a way of making a leadless multi-chip electronic module in which small leadframe bond pads subject to solder joint failure due to thermal cycle stress are positioned in a central low-stress region of the module. Larger bond pads less subject to solder joint failure due to thermal cycle stress are positioned laterally outboard of the small bond pads and support IC chips that are electrically coupled to the small bond pads.

Figure 1A:
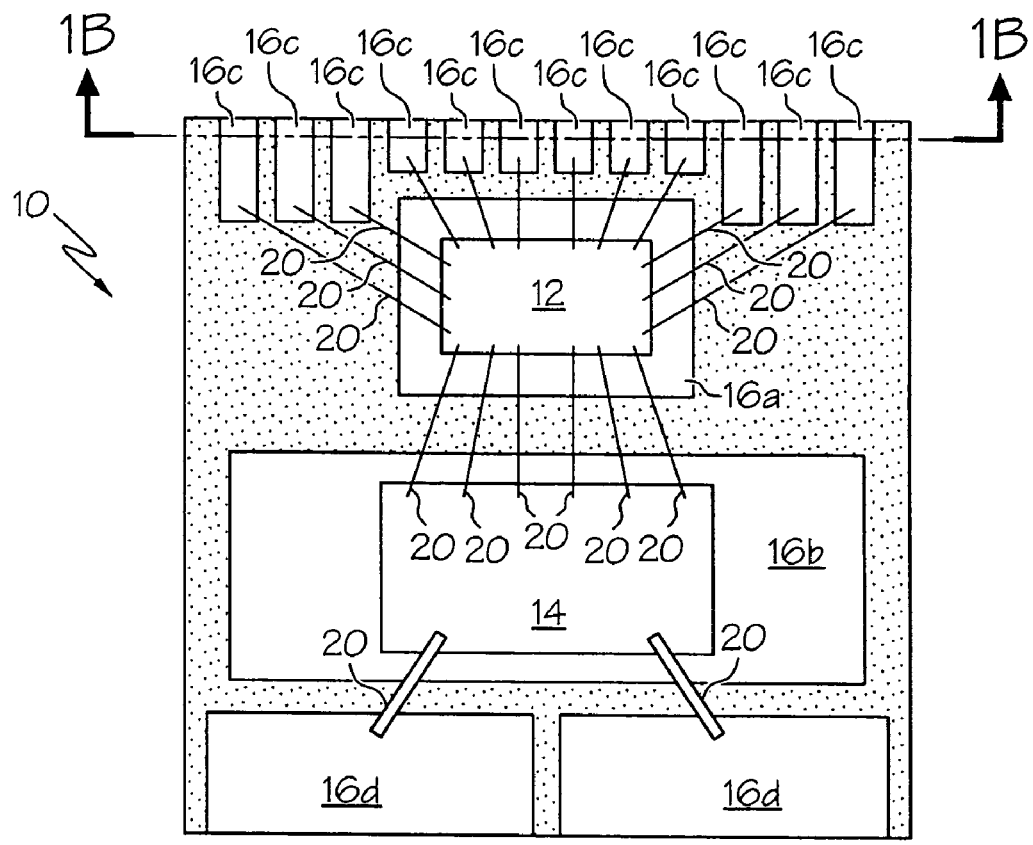
FIG. 1A is a top view of a prior art encapsulated leadless multi-chip electronic module, with the encapsulant partially removed to expose the leadframe bond pads, IC chips and wirebonds.
Figure 1B:
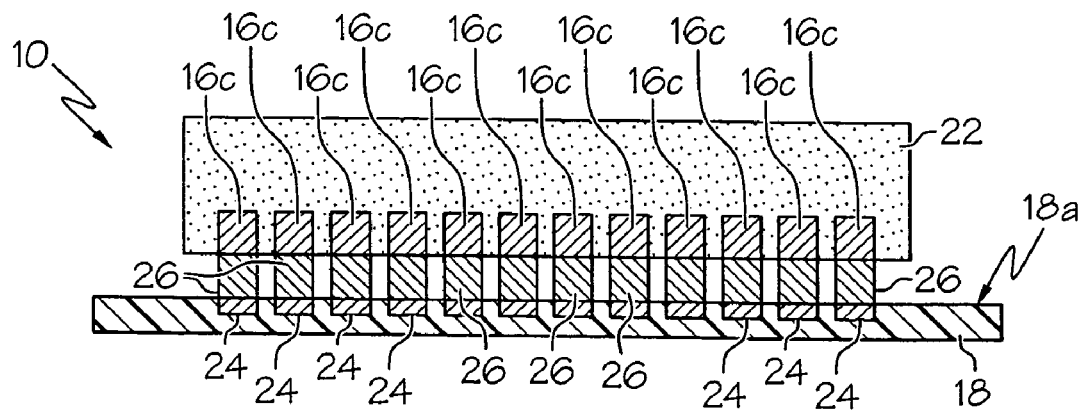
FIG. 1B is a cross-sectional view of the prior art electronic module of FIG. 1A along lines 1B-1B, as mounted on a substrate.
Figure 2:
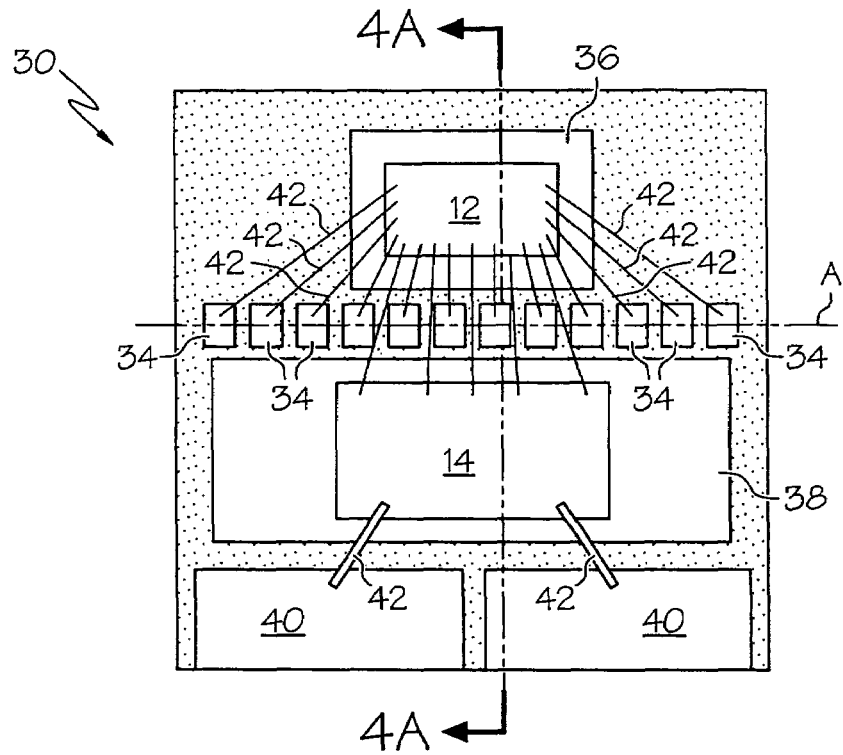
FIG. 2 is a top view of a leadless multi-chip electronic module configured according to a first embodiment this invention, with the encapsulant partially removed to expose the leadframe bond pads, IC chips and wirebonds.
Figure 3:
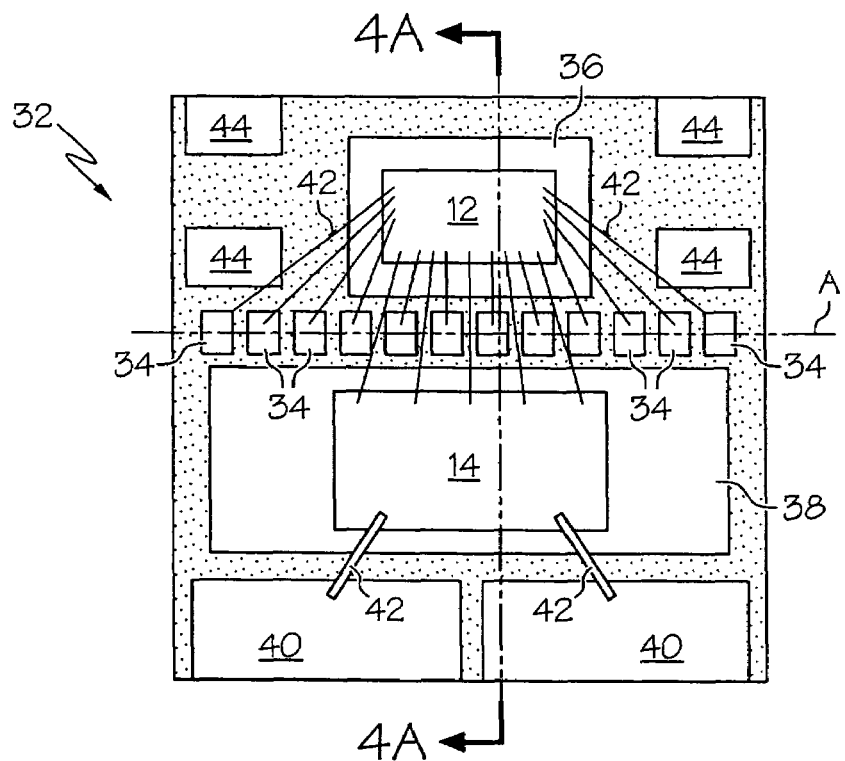
FIG. 3 is a top view of a leadless multi-chip electronic module configured according to a second embodiment this invention, with the encapsulant partially removed to expose the leadframe bond pads, IC chips and wirebonds.

FIGS. 2 and 3 respectively depict first and second leadless multi-chip electronic modules 30, 32 manufactured according to this invention. In each case, a set of small signal bond pads 34 are disposed in a linear array along an axis A between two larger IC bond pads 36 and 38. Two large power bond pads 40 are placed at the lower periphery of the modules 30, 32 as in FIG. 1A. Also as in FIG. 1A, IC chips 12 and 14 are respectively soldered to bond pads 36 and 38, and wirebonds 42 electrically couple the IC chips 12 and 14 and the signal and power bond pads 34 and 40. Since the signal bond pads 34 lie in low thermal stress regions of the modules 30 and 32, they may be uniformly small in surface area as shown without sacrificing solder joint reliability.

The module 32 of FIG. 3 differs from the module 30 of FIG. 2 by the addition of large extraneous or "dummy" bond pads 44 in unused peripheral regions of the module. The large solder joints between the "dummy" bond pads 44 and the substrate 18 add mechanical strength to the module 32 by absorbing thermal-related stress that would otherwise be applied to the smaller solder joints between the signal bond pads 34 and the substrate 18. Additionally, the solder joints between the "dummy" bond pads 44 and the substrate 18 enhance thermal transfer from the IC chips 12 and 14 to the substrate 18.

According to this invention, the signal bond pads 34 in the central region of modules 30 and 32 are formed by a pair of bottom-side partial saw cuts of the leadframe parallel to the axis A of FIGS. 2-3 prior to soldering the leadframe bond pads 34-40 to the substrate 18. Initially, each of the signal bond pads 34 is defined by a leadframe element extending substantially perpendicular to the axis A. Leadframe elements disposed between the IC bond pads 36 and 38 bridge the bond pads 36 and 38; leadframe elements laterally outboard of the IC bond pad 36 extend from the IC bond pad 38 to another bond pad or the leadframe web. A first bottom-side partial saw cut parallel to axis A adjacent the edge of IC bond pad 38 removes leadframe metal to electrically isolate the leadframe elements from the IC bond pad 38. A second bottom-side partial saw cut parallel to axis A adjacent the edge of IC bond pad 36 removes leadframe metal to electrically isolate the leadframe elements from the IC bond pad 36 or other leadframe components on that side of axis A. The process effectively converts the leadframe elements into the small signal bond pads 34.

Figure 4A:
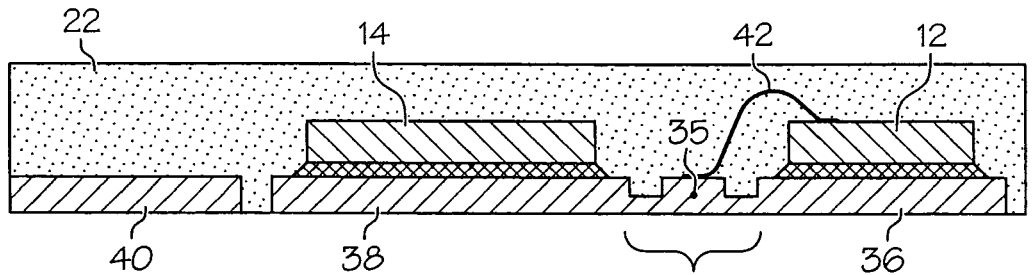
FIG. 4A is a before-sawing cross-sectional view of the electronic modules of FIGS. 2-3 along lines 4A-4A.
Figure 4B:
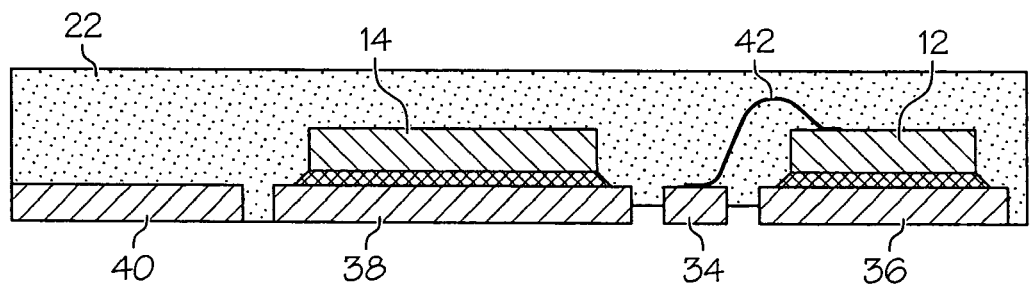
FIG. 4B is an after-sawing cross-sectional view of the electronic modules of FIGS. 2-3 along lines 4A-4A.
Figure 4C:
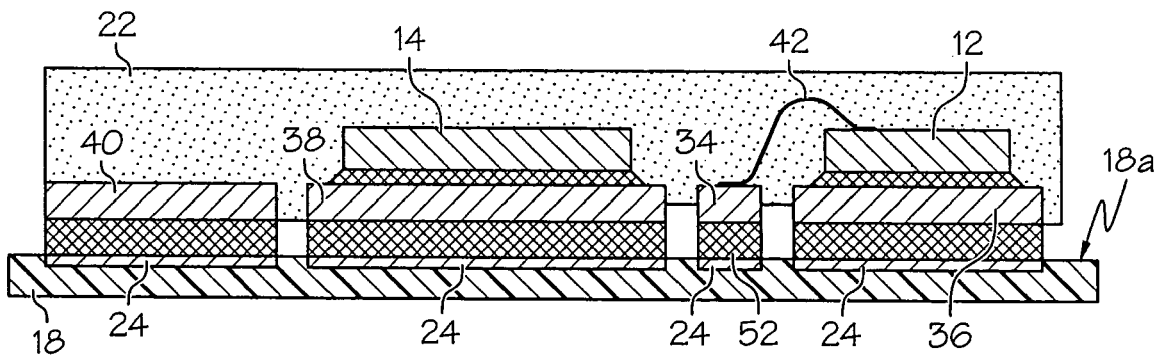
FIG. 4C is a cross-sectional view of the electronic module of FIG. 4B, as mounted on a substrate.

The above described process is illustrated in FIGS. 4A-4C, which depict cross-sectional views of the modules 30 and 32 as indicated in FIGS. 2-3. In FIG. 4A, an un-cut leadframe element is designated by the reference numeral 50, and the location of axis A is designated by the reference numeral 35. Preferably, the leadframe elements 50 are initially half-etched to form top-side notches in vertical alignment with the bottom-side partial saw cuts; this maintains the mechanical integrity of the leadframe while substantially halving the amount of leadframe metal to be removed by the partial saw cuts. FIG. 4B depicts the modules 30 and 32 after both of the bottom-side partial saw cuts have been performed. As illustrated, the portion of the leadframe element 50 not removed by the saw cuts becomes the small signal bond pad 34. The same two partial saw cuts thereby convert each of the leadframe elements 50 into a signal bond pad 34. The cross-section of FIG. 4C illustrates the modules 30 and 32 after soldering of the leadframe bond pads 34, 36, 38 and 40 to corresponding bond pads 24 formed on the inboard face 18a of substrate 18. While the solder joint 52 formed between signal bond pad 34 and the substrate bond pad 24 is small in size, its placement in a low-stress region of the module 30 or 32 ensures that it will be able to withstand thermal-related stresses with satisfactory reliability.

Figure 5:
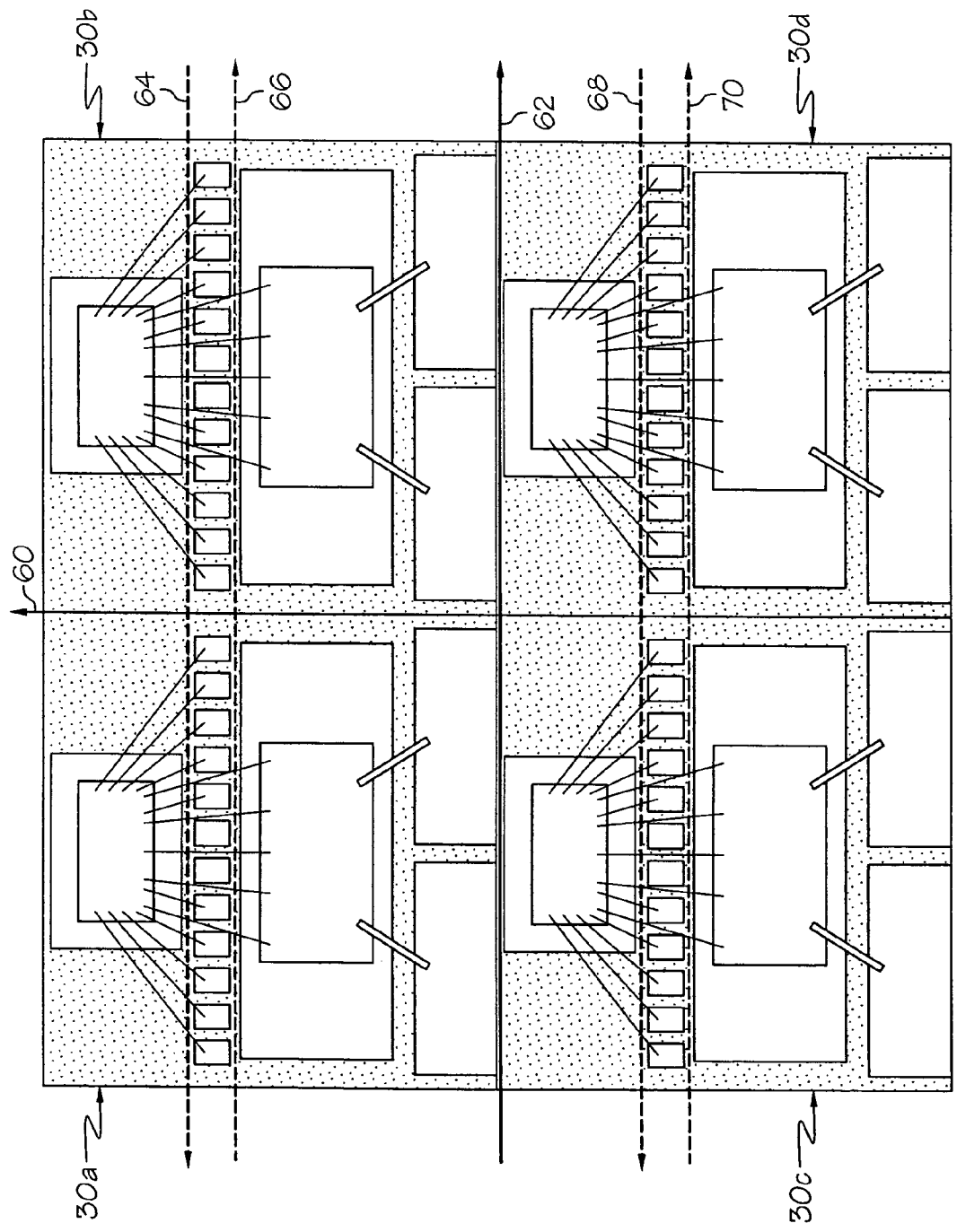
FIG. 5 is a top view of a set of four electronic modules of the type depicted in FIG. 2, including full and partial saw cuts for singulation and signal bond pad formation.

In practice, several modules are manufactured as a unitary structure and then singulated into individual electronic modules by full saw cuts, as illustrated in respect to the module 30 in FIG. 5. In that illustration, four modules 30a, 30b, 30c and 30d are manufactured as unitary structure, and the full saw cuts for singulation of the modules 30a-30d occur along the solid lines 60 and 62. The partial saw cuts for modules 30a and 30b occur along the broken lines 64 and 66; and the partial saw cuts for modules 30c and 30d occur along the broken lines 68 and 70. Preferably, the partial saw cuts are made prior to the full (singulation) saw cuts. Of course, any number of modules may be manufactured as a unitary structure, and FIG. 5 is presented by way of example only.

In summary, the present invention provides a method of manufacturing leadless multi-chip electronic modules in a way that dramatically improves solder joint reliability. The partial saw cuts required to form the centrally located signal bond pads 34 do not significantly increase manufacturing cost, as multiple full saw cuts are already required for singulation of the modules.

While the present invention has been described with respect to the illustrated embodiments, it is recognized that numerous modifications and variations in addition to those mentioned herein will occur to those skilled in the art. For example, the number of IC chips utilized in a module manufactured according to this invention may be different than shown, the IC chips may be secured to the IC bond pads by an adhesive material, thermal vias may be utilized for improved heat transfer, and so on. Accordingly, it is intended that the invention not be limited to the disclosed embodiment, but that it have the full scope permitted by the language of the following claims.

The invention claimed is:

1. A method of manufacturing a leadless multi-chip electronic module including a metal leadframe having first and second chip-sized bond pads and a plurality of smaller signal bond pads, IC chips attached to upper surfaces of said chip-sized bond pads, and electrical interconnects between said IC chips and upper surfaces of said signal bond pads, the method comprising the steps of:

configuring said metal leadframe such that the first and second chip-sized bond pads are oppositely disposed about an axis and separated by a space sufficient in width to accommodate a linear array of said signal bond pads therebetween, said signal bond pads being initially defined by a plurality of leadframe elements disposed in said space and extending perpendicular to said axis;

covering said IC chips, said electrical interconnects, and the upper and lateral surfaces of said chip-sized and signal bond pads with an encapsulant;

removing portions of said metal leadframe elements adjacent said first and second chip-sized bond pads to convert said leadframe elements into an equal number of bond pads electrically isolated from other portions of said leadframe; and soldering bottom surfaces of said chip-sized bond pads and said signal bond pads to corresponding bond pads formed on a substrate.

2. The method of claim 1, including the step of:
configuring said leadframe to include at least one dummy bond pad in alignment with a marginal area of said substrate.

3. The method of claim 1, including the step of:
removing said portions of said metal leadframe elements adjacent said first and second chip-sized bond pads by sawing from lower surfaces of said portions.

4. The method of claim 3, including the step of:
making first and second partial saw cuts parallel to said axis and sufficient in depth to remove said portions of said metal leadframe elements.

5. The method of claim 3, where said first partial saw cut is adjacent said first chip-sized bond pad, and said second partial saw cut is adjacent said second chip-sized bond pad.

6. The method of claim 3, including the step of:
half-etching upper surfaces of said portions of said metal leadframe elements before covering said leadframe elements with said encapsulant.

7. A method of manufacturing a leadless multi-chip electronic module, comprising the steps of:

providing a metal leadframe having a plurality of leadframe elements disposed in a linear array along an axis and extending perpendicular to said axis, and first and second chip-sized bond pads oppositely disposed about said axis and joined by one or more of said leadframe elements;

attaching first and second IC chips to upper surfaces of said first and second chip-sized bond pads, respectively;

forming electrical interconnects between said IC chips and upper surfaces of said leadframe elements along said axis;

covering said IC chips, said electrical interconnects, said chip-sized bond pads, and said leadframe elements with an encapsulant;

removing portions of said leadframe elements adjacent said first and second chip-sized bond pads to convert said leadframe elements into an equal number of signal bond pads joined to said IC chips by said electrical interconnects but electrically isolated from other portions of said leadframe; and soldering said chip-sized bond pads and said signal bond pads to corresponding bond pads of a substrate.

8. The method of claim 7, including the step of:

configuring said leadframe to include at least one dummy bond pad in alignment with a marginal area of said substrate.

9. The method of claim 7, including the step of:

removing said portions of said metal leadframe elements adjacent said first and second chip-sized bond pads by sawing from a lower surface of said leadframe.

10. The method of claim 9, including the step of:

making first and second partial saw cuts parallel to said axis and sufficient in depth to remove said portions of said metal leadframe elements.

11. The method of claim 9, where said first partial saw cut is adjacent said first chip-sized bond pad, and said second partial saw cut is adjacent said second chip-sized bond pad.

12. The method of claim 9, including the step of:

half-etching upper surfaces of said portions of said metal leadframe elements before covering said leadframe elements with said encapsulant.

* * * * *